United States Patent

Tashiro et al.

(10) Patent No.: US 7,616,071 B2
(45) Date of Patent: Nov. 10, 2009

(54) PLL CIRCUIT AND SEMICONDUCTOR DEVICE PROVIDED WITH PLL CIRCUIT

(75) Inventors: Tomonari Tashiro, Kanagawa (JP); Taketo Hachigo, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 228 days.

(21) Appl. No.: 11/450,415

(22) Filed: Jun. 12, 2006

(65) Prior Publication Data

US 2006/0280277 A1  Dec. 14, 2006

(30) Foreign Application Priority Data

Jun. 14, 2005  (JP)  ............................. 2005-173218
Apr. 26, 2006  (JP)  ............................. 2006-122058

(51) Int. Cl.
*H03B 29/00* (2006.01)

(52) U.S. Cl. ............................. 331/78; 331/17; 327/157

(58) Field of Classification Search .................. 331/16, 331/17, 78; 327/157
See application file for complete search history.

(56) References Cited

U.S. PATENT DOCUMENTS

| | | | | |
|---|---|---|---|---|
| 6,449,167 | B1 * | 9/2002 | Seymour | 361/760 |
| 6,856,204 | B2 * | 2/2005 | Kwon | 331/17 |
| 7,030,688 | B2 * | 4/2006 | Dosho et al. | 327/558 |

FOREIGN PATENT DOCUMENTS

| | | |
|---|---|---|
| JP | 02-252316 | 10/1990 |
| JP | 2-252316 | 10/1990 |
| JP | 04-009778 | 1/1992 |
| JP | 2000-230953 | 8/2000 |
| JP | 2005-311564 | 11/2005 |
| WO | WO2005/104368 | 11/2005 |

OTHER PUBLICATIONS

Japanese Office Action dated Aug. 5, 2008 with Partial English Translation.

* cited by examiner

*Primary Examiner*—Robert Pascal
*Assistant Examiner*—James E Goodley
(74) *Attorney, Agent, or Firm*—McGinn IP Law Group, PLLC

(57) ABSTRACT

Disclosed is a PLL circuit of a small circuit size capable of generating clock including a jitter component with ease. A phase comparator 11 compares the phase of an input reference clock signal CKR to the phase of a signal fed back from a frequency divider 14 to route an output signal corresponding to the phase difference to a filter unit 12. The filter unit 12 detects a low frequency component of the output signal of the phase comparator 11 to route the so detected component to a voltage controlled oscillator 13. The voltage controlled oscillator 13 generates, as an output signal CKF, an oscillation signal of an oscillation frequency which is controlled on the basis of the output voltage of the filter unit 12. The frequency divider 14 divides the frequency of the output signal CKF to output the resulting signal to the phase comparator 11. An end A of a wiring of a wiring part 15 is connected to an output P of the filter unit 12 in such a manner that noise will be induced from outside and added to the output signal of the filter unit 12. The oscillation frequency of the output signal CKF, generated by the voltage controlled oscillator 13, is subjected to variations by noise.

20 Claims, 15 Drawing Sheets

PLL CIRCUIT AND SEMICONDUCTOR DEVICE PROVIDED WITH PLL CIRCUIT

FIELD OF THE INVENTION

This invention relates to a PLL (Phase Locked Loop) circuit and a semiconductor device provided with the PLL circuit. More particularly, this invention relates to a PLL circuit for generating the jitter and to a semiconductor device provided with this PLL circuit.

BACKGROUND OF THE INVENTION

Recently, the data transfer speed between different devices is increasing, and transmission at a high data rate has been realized. In such high data rate transmission, it becomes difficult to secure the skew among parallel signals, in parallel transmission, and hence the limit to the transfer speed has become apparent. Thus, as a matter of preference, serial transmission has come to be utilized for high speed transmission. In such high speed serial transmission, jitter characteristics are felt to be crucial. As the transmission speed increases, the jitter, that is, variations in a signal, which are not of a problem in the low speed transmission, becomes apparent with increase in the transmission speed, and is presented as increasing transmission errors. In case the jitter has increased to more than a certain level, data transmission ceases to be carried out in the normal manner.

In case a transmitter suffers a certain amount of jitter, the jitter ascribable to frequency characteristics of a signal line or to ISI (Inter Symbol Interference) is superposed on the jitter, innate to the transmitter, as a result of signal transmission. In reproducing the digital signal per se, that is, the original digital signal which is to be transmitted, a receiver has to receive a signal added to with the jitter innate to the transmitter and with the jitter produced in the course of transmission. Hence, in a transmission system, jitter tolerance characteristics of the receiver need to be measured at the outset.

One of the methods for measurement of such jitter tolerance characteristics is putting in a jitter component on data. In this case, phase modulation or FM (frequency modulation) is applied to data and the resulting data is sent to a serial I/F device in order to test whether or not CDR (Clock and Data Recovery) of the device is able to receive the data as normally. For this test, it is necessary to construct an environment for measurement in which the data is modulated and the jitter component is put in on the so modulated data.

There is also a method for putting in the jitter component on the clock supplied to the CDR. Receiving normal data by the CDR operating as it takes the clock modulated with the jitter is tantamount to receiving data modulated with the jitter by the CDR operating with the normal clock, and hence a similar test may be conducted for each of these cases. For this test method, it is similarly necessary to construct the environment for measurement.

Meanwhile, in a transmission system, a PLL circuit is used at some times for generating the timing clock for transmission/reception. The PLL circuit is designed for receiving the reference clock to output the clock of a multiple frequency of the reference clock frequency. In such PLL circuit, the routine practice is to generate the clock of the multiple frequency by a voltage controlled oscillator (VCO). There has been known a technique in which a modulated signal generator is mounted directly ahead of the voltage controlled oscillator to impart frequency variations to the output signal from the voltage controlled oscillator, such as to generate the clock containing the jitter component (see Patent Documents 1 and 2, for example).

In a PLL circuit, described in Patent Document 1, the signal output with the frequency corresponding to the voltage of a control signal from the voltage controlled oscillator is divided by a frequency divider. The frequency-divided signal and a reference signal output from the reference signal generator are supplied to a phase frequency detector. An error signal corresponding to the phase difference between the frequency-divided signal and the reference signal is extracted by a low-pass filter from the output signal of the phase frequency detector. An adder adds this error signal to a modulating signal output from a modulating signal generator. The resulting sum signal is supplied as a control signal to the voltage controlled oscillator. The modulating signal generator outputs to the adder a modulating signal of the frequency equal to the jitter frequency as specified and the amplitude corresponding to the amount of the jitter as specified. An output signal from the voltage controlled oscillator is the clock subjected to variations in the frequency and containing the jitter component.

In a PLL circuit, described in Patent Document 2, an adder for adding a signal from a signal generator is included in a phase locked loop composed of a phase comparator, a low-pass filter and a voltage controlled oscillator. With the PLL circuit of the configuration, described above, a large variety of jitter simulations is possible, depending on a pattern of signals, such as a sine wave, a triangular wave and a frequency modulated wave.

[Patent Document 1]
JP Patent Kokai Publication No. JP-P2000-230953A (FIG. 2)

[Patent Document 2]
JP Patent Kokai Publication No. JP-A-2-252316 (FIG. 1)

SUMMARY OF THE DISCLOSURE

Up to now, a receiving test for a device is carried out as the jitter component is put on data or on the clock. In such case, a device equivalent to a measurement unit is needed for applying jitter modulation to a clock generator or to a data generator. For example, the technique stated in Patent Document 1 is in need of a controllable modulating signal generator. The technique stated in Patent Document 2 is in need of an adder for adding a signal from a signal generator. Moreover, the signal generator has to be enclosed, or there has to be provided an input terminal from the signal generator. However, in such configuration, the circuit tends to be increased in size in consideration that the circuit has to be mounted on, e.g., an LSI chip such that the clock with the jitter superposed thereon will be generated with ease.

In one aspect, the present invention provides a PLL circuit comprising a phase comparator that compares the phase of a reference input signal to that of a feedback output signal of a frequency divider to output a signal corresponding to the phase difference therebetween, a filter unit that passes a low frequency component of an output signal of the phase comparator, and a voltage controlled oscillator that generates an oscillation signal of an oscillation frequency controlled on the basis of an output voltage from the filter unit. The frequency divider frequency-divides the oscillation signal to output the resulting signal to the phase comparator. The PLL circuit comprises a wiring part for inducing noise from outside. The noise signal, induced in the wiring part, is added to an output signal from the filter unit.

In another aspect, the present invention provides a PLL circuit comprising a phase comparator that compares the phase of a reference input signal to that of a feedback output signal of a frequency divider to output a signal corresponding to the phase difference therebetween, a filter unit that passes a low frequency component of an output signal of the phase comparator, and a voltage controlled oscillator that generates an oscillation signal of an oscillation frequency controlled on the basis of an output voltage of the filter unit. The frequency divider frequency-divides the oscillation signal to output the resulting signal to the phase comparator. The PLL circuit comprises a wiring part that induces noise from outside and a low-pass filter LPF connected to the wiring part. The noise signal, induced in the wiring part, is added via the LPF to an output signal from the filter unit.

The meritorious effects of the present invention are summarized as follows.

According to the present invention, a wiring part, configured so as to induce the noise from outside, is simply added to a conventional PLL circuit. Nonetheless, the clock containing a jitter component may be generated with ease by a small-sized circuit.

Furthermore, according to the present invention, the frequency component of the noise induced may be controlled with an LPF connected to the wiring part despite the simplified configuration of the circuit used.

PREFERRED EMBODIMENTS OF THE INVENTION

Figure 1:
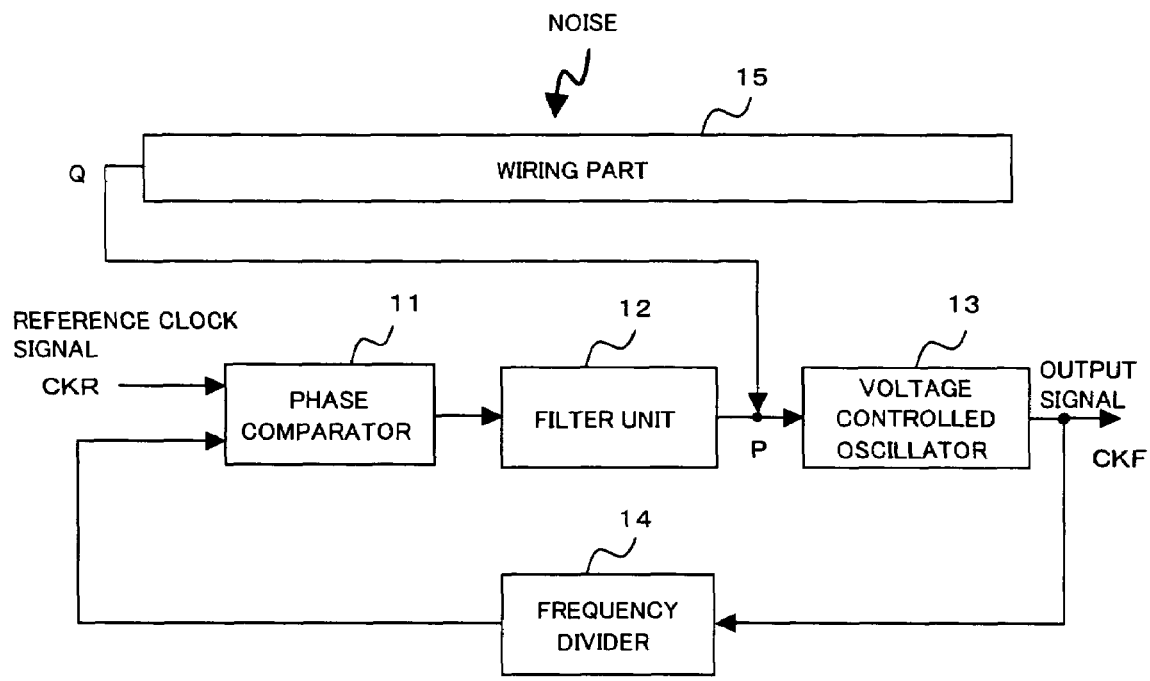
FIG. 1 is a block diagram showing the construction of a PLL circuit embodying the present invention.

FIG. 1 depicts a block diagram showing the configuration of a PLL circuit embodying the present invention. Referring to FIG. 1, the PLL circuit includes a phase comparator 11, a filter unit 12, a voltage controlled oscillator 13, a frequency divider 14 and a wiring part 15. The phase comparator 11 compares the phase of the input reference clock signal CKR to that of a signal fed back from the frequency divider 14 to output a signal corresponding to the phase difference therebetween to the filter unit 12. The filter unit 12 detects the low frequency component of the output signal of the phase comparator 11 to output the so detected component to the voltage controlled oscillator 13. The voltage controlled oscillator generates, as an output signal CKF, an oscillation signal of an oscillation frequency which is controlled on the basis of an output voltage of the filter unit 12. The frequency divider 14 frequency-divides the output signal CKF to output the resulting signal to the phase comparator 11. One end Q of a wiring of the wiring part 15 is connected to an output P of the filter unit 12 in such a manner that the noise from outside will be induced and the so induced noise will be added to an output signal of the filter unit 12.

In the above-described PLL circuit, the noise induced from outside is added to an output signal of the filer unit 12 and the resulting signal is supplied to the voltage controlled oscillator 13. The oscillation frequency of the output signal CKF, generated by the voltage controlled oscillator 13, is subjected to variations due to the noise. This means that the jitter component caused by the noise is superimposed on the output signal CKF.

In such PLL circuit, the output signal CKF, which is the clock subjected to modulation by the jitter, is supplied to e.g. the CDR, to test jitter tolerance characteristics, without having to provide an environment for measurement in which the jitter is put in on data or on the clock. In this case, the clock, with the jitter superposed thereon, may be generated by a simplified circuit configuration, without the necessity of providing a modulating signal generator such as is needed with the conventional technique. The PLL circuit is extremely simple in circuit configuration and hence may be conveniently mounted in particular on a semiconductor device.

First Embodiment

Figure 2:
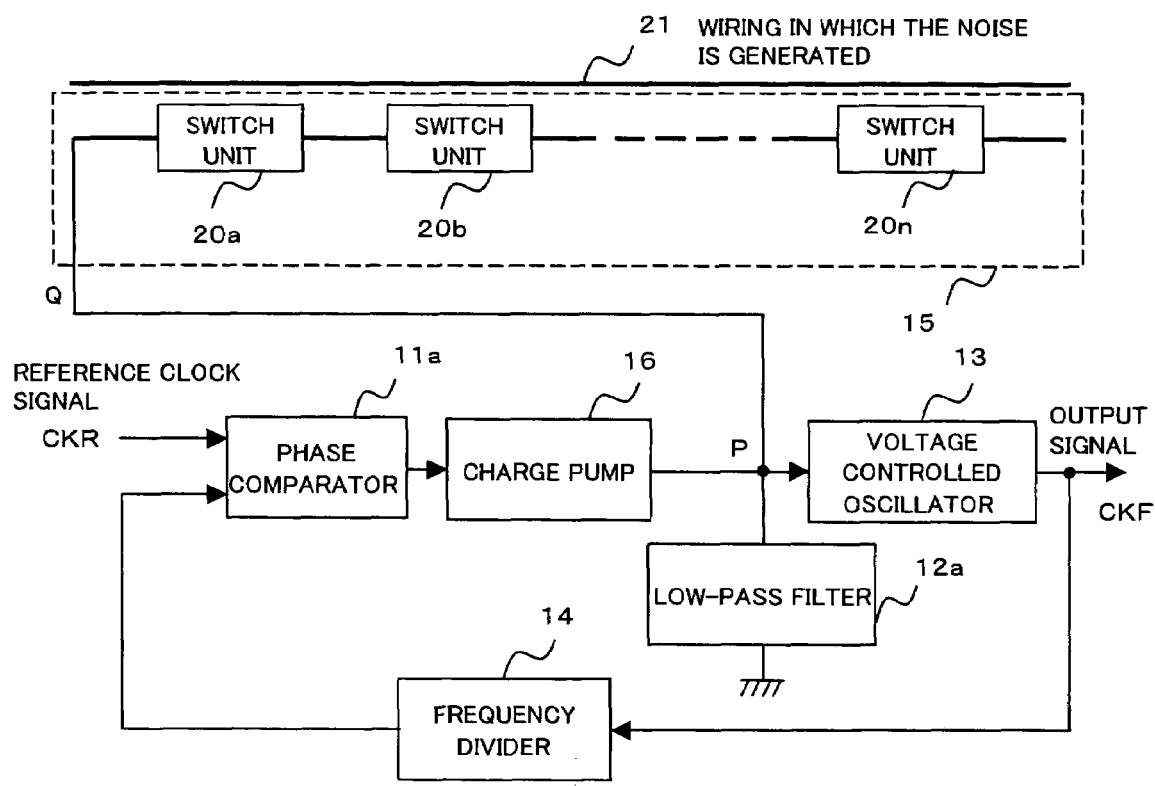
FIG. 2 is a block diagram showing the construction of a PLL circuit according to a first embodiment of the present invention.

FIG. 2 depicts a block diagram showing the configuration of a PLL circuit of a first embodiment of the present invention. The PLL circuit of FIG. 2 includes a phase comparator 11a, a voltage controlled oscillator 13, a frequency divider 14, a wiring part 15, a charge pump 16, and a low-pass filter 12a. The basic operation of the present embodiment is the same as that of the PLL circuit of FIG. 1. In FIG. 2, the same symbols or marks as those used in FIG. 1 denote the same parts or components, and the corresponding description is dispensed with. An output of the phase comparator 11a is supplied to the charge pump 16. An output of the charge pump 16 is connected to the one end P of the low-pass filter 12a, to the input of the voltage controlled oscillator 13 and to an end Q of the wiring part 15. The phase comparator 11a compares the phase of an input reference clock signal CKR to that of a signal fed back from the frequency divider 14 to output an up-signal or a down-signal of a pulse width corresponding to the result of phase comparison. The charge pump 16 outputs current pulses which are positive or negative responsive to the up-signal or the down-signal. These current pulses are integrated by the low-pass filter 12a and output to the voltage controlled oscillator 13 as a control signal freed of high frequency components. However, the variations ascribable to the noise signal, induced by the wiring part 15, are contained in this control signal. The voltage controlled oscillator 13 generates, as output signal CKF, an oscillation signal of an oscillation frequency which is based on the control signal. Since the variations caused by the noise signal are contained in the control signal, the jitter component has now come to be contained in the output signal CKF.

Figure 3:
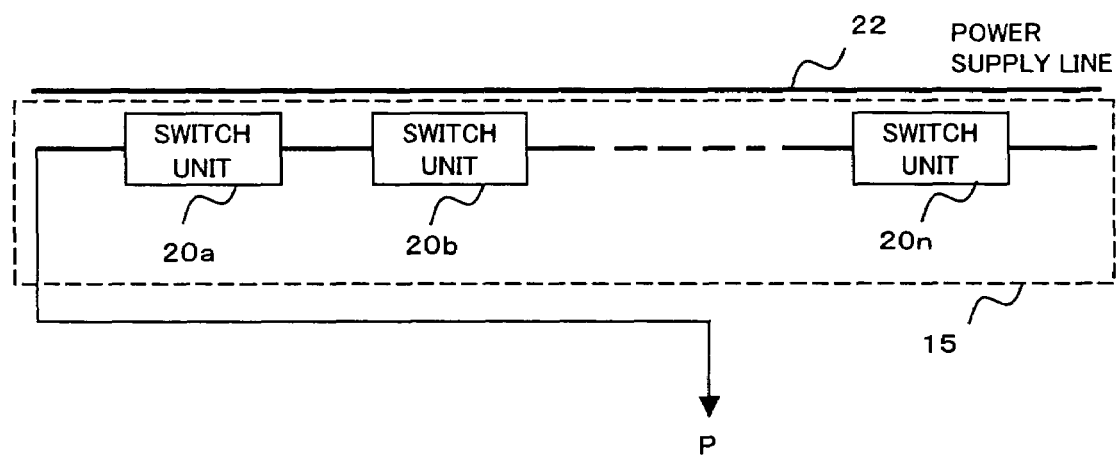
FIG. 3 shows a typical arrangement of a wiring part.
Figure 4:
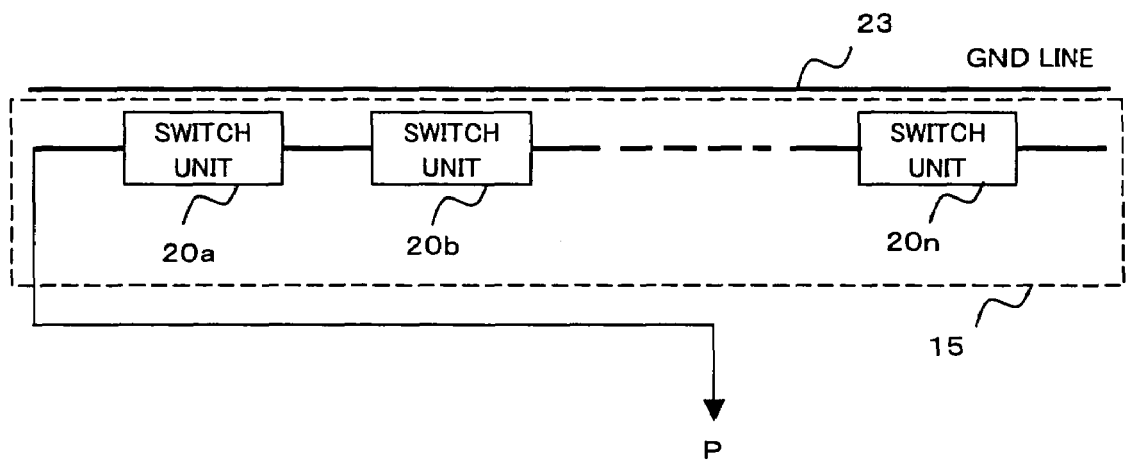
FIG. 4 shows another typical arrangement of the wiring part.
Figure 5:
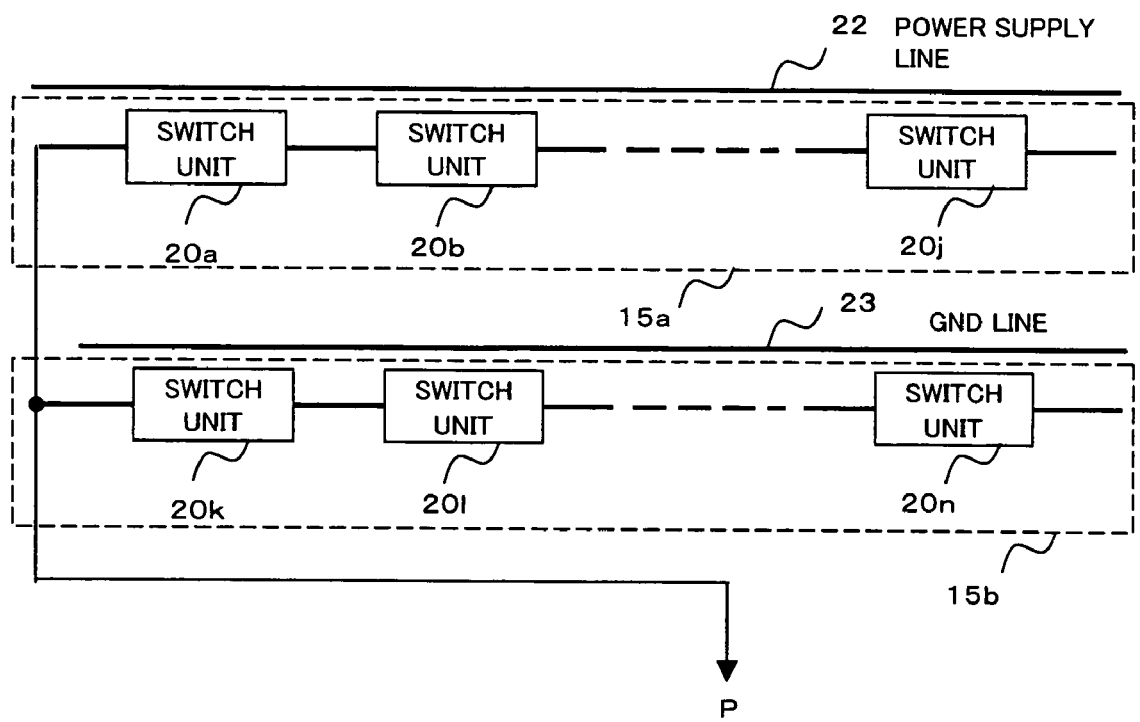
FIG. 5 shows a further typical arrangement of the wiring part.

The wiring part 15 will now be described in detail. The wiring part 15 is arranged in proximity to a wiring (conductor) 21 in which the noise is generated. This wiring 21, in which the noise is generated, is preferably a power supply line 22 shown in FIG. 3 or a GND line 23 shown in FIG. 4. The power supply line 22 or the GND line 23 is provided in a semiconductor device in which the PLL circuit is embedded and in which there is generated the noise as a result of the operations of the semiconductor device. The wiring part may be divided into wiring parts 15a and 15b, which are arranged in proximity to the power supply line 22 and to the GND line 23, respectively, as shown in FIG. 5.

By mounting the wiring part 15 in proximity to a wiring 21, such as the power supply line 22 or the GND line 23, susceptible to the noise, the noise may be induced in the wiring part 15 by capacitive coupling and/or electromagnetic induction, in a manner free from direct coupling. The so induced noise becomes the jitter component for the outstanding oscillation frequency of the output signal CKF of the voltage controlled oscillator 13. It is noted that a larger noise may be induced with the configuration shown in FIG. 5.

The wiring part 15 includes switch units 20a to 20n. The wiring within the wiring part 15 is divided into plural wiring segments, depending on the number of switch units 20a to 20n, so that the effective length, that is, the noise-inducing length, of the wiring, will be adjustable. The switch units 20a to 20n are each mounted to connect adjacent wiring segments to each other. The turning on/off of the switch units 20a to 20n is controlled by a control signal, not shown. If the switch units 20a, 20b, ..., 20n are arrayed in this order when looking from the end Q of the wiring of the wiring part 15, the wiring length becomes shortest when all the switch units are opened, with the wiring length becoming progressively longer by sequentially closing the switch units 20a, 20b, ..., 20n. The length of the wiring is changed in this manner by opening/closing the switch units 20a to 20n to control the amplitude of the induced noise. The amount of the jitter of the output signal from the voltage controlled oscillator 13 may be made variable by controlling the noise amplitude.

Figure 6A:
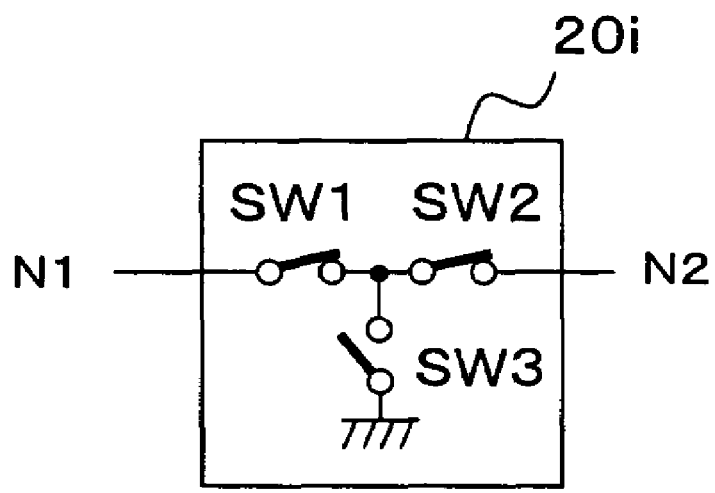
FIGS. 6A and 6B show the construction of a switch unit.
Figure 6B:
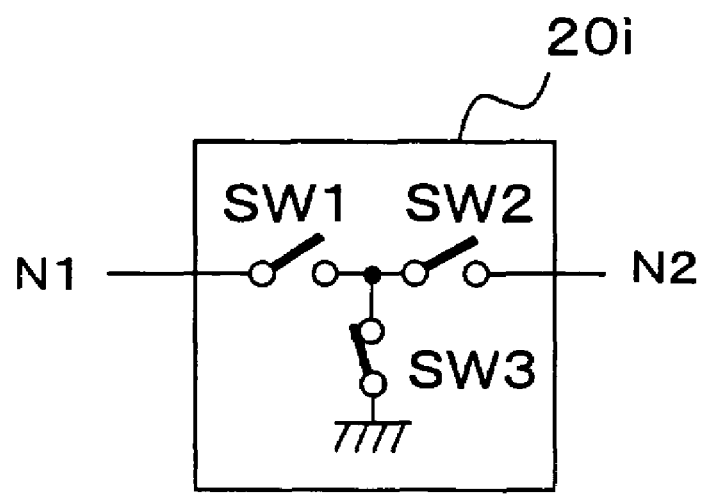

The configuration of the switch unit will now be described. FIGS. 6A and 6B show the configuration of the switch unit 20i, where i=a to n. The switch unit 20i includes switch devices SW1, SW2 and SW3. The switch devices SW1 and SW2 are connected in cascade between one end N1 of a wiring segment and one end N2 of the neighboring wiring segment. The switch device SW3 is connected between a junction point of the switch devices SW1 and SW2 and the ground or a power supply (to the ground in the case shown in FIGS. 6A and 6B). The switch devices SW1 and SW2 execute the opening/closing operation which is antiphase relative to that of the switch device SW3. That is, control is exercised so that, when the switch devices SW1 and SW2 are on, the switch device SW3 is turned 'off', as shown in FIG. 6A, and so that, when the switch devices SW1 and SW2 are off, the switch device SW3 is turned 'on', as shown in FIG. 6B.

When the switch unit is in a state shown in FIG. 6B, the switch device SW3 is turned on in order to deal successfully with the case where the switch devices SW1, SW2 are not completely turned off due to, for example, capacitive coupling. This couples the point of junction of the switch devices SW1, SW2 to the ground potential GND to interrupt the noise which may otherwise be transmitted by capacitive coupling of the switch devices SW1, SW2 which are in the open state.

Figure 7:
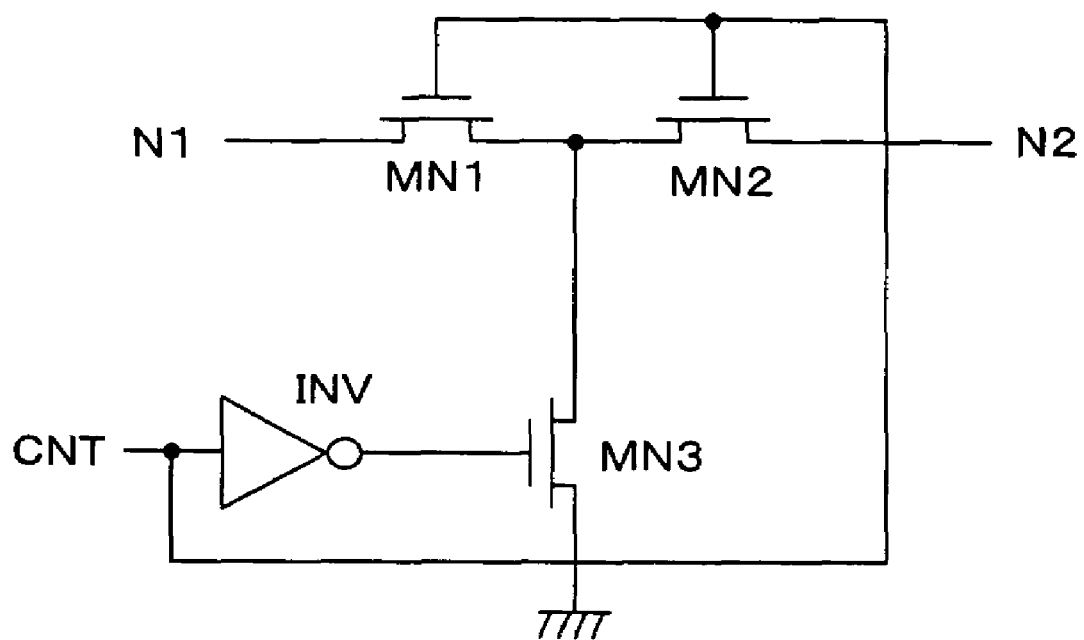
FIG. 7 shows the construction of a switch unit formed by NMOS transistors.

The concrete circuit configuration of the switch unit will now be described. FIG. 7 shows the concrete circuit configuration of the switch unit 20i where i=a to n. The switch devices SW1, SW2 and SW3 in FIGS. 6A and 6B are each constituted by NMOS transistors MN1, MN2 and MN3, respectively. The gates of the NMOS transistors MN1 and MN2 receive a control signal CNT, which controls the opening/closing of the switch unit, whilst the gate of the NMOS transistor MN3 receives a signal which is an inversion of the control signal CNT by an inverter INV. The NMOS transistors MN1 and MN2 on one hand and the NMOS transistor MN3 on the other are controlled in opening/closing by the control signal CNT in antiphase relative to each other. Since the switch unit may readily be constructed by three NMOS transistors and a sole inverter, the overall circuit may be reduced in size.

Figure 8:
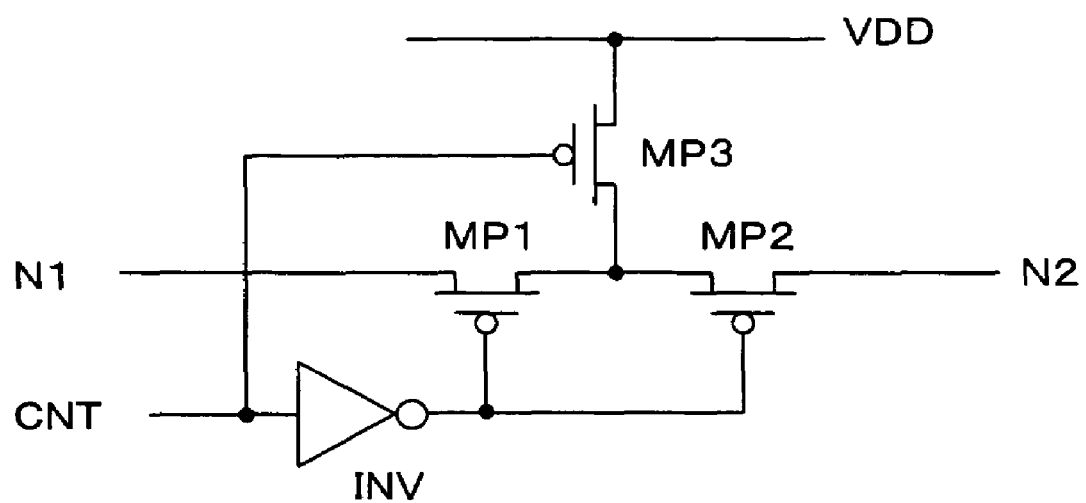
FIG. 8 shows the construction of a switch unit formed by PMOS transistors.

Alternatively, the switch devices SW1, SW2 and SW3 in FIGS. 6A and 6B may each be constituted by PMOS transistors MP1, MP2 and MP3, respectively, as shown in FIG. 8. In this case, one node (or junction point that constitutes a switch unit, i.e., one node of MP3) of the PMOS transistors MP1, MP2 and MP3 is connected to the power supply VDD. The gate of the PMOS transistor MP3 is supplied with the control signal CNT, which controls the opening/closing of the switch unit, whilst the gates of the PMOS transistors MP1 and MP2 are supplied with a signal which is an inversion of the control signal CNT via an inverter INV. The PMOS transistors MP1 and MP2 on one hand and the PMOS transistor MP3 on the other are controlled as to opening/closing by the control signal CNT in antiphase relative to each other. Since the switch unit may readily be constructed by three PMOS transistors and the sole inverter, the overall circuit may be reduced in size.

Figure 9:
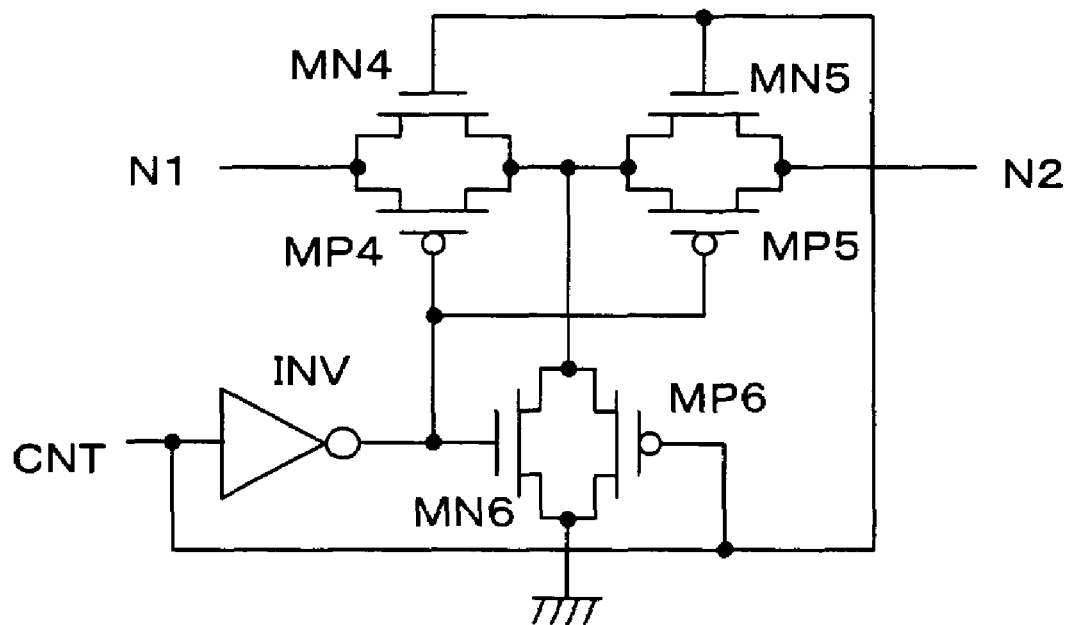
FIG. 9 shows the construction of a switch unit formed by a transfer gate.

The switch devices SW1, SW2 and SW3 in FIGS. 6A and 6B may also be constituted by a transfer gate, made up by an NMOS transistor MN4 and a PMOS transistor MP4, another transfer gate, made up by an NMOS transistor MN5 and a PMOS transistor MP5 and a further transfer gate, made up by an NMOS transistor MN6 and a PMOS transistor MP6, respectively, as shown in FIG. 9. The gates of the NMOS transistors MN4, MN5 and the PMOS transistor MP6 are supplied with a control signal CNT, which controls the opening/closing of the switch unit, whilst the gates of the NMOS transistor MN6 and the PMOS transistors MP4, MP5 are supplied with a signal which is the inversion of the control signal CNT by the inverter INV. The opening/closing of the NMOS transistors MN4, MN5 and the PMOS transistors MP4, MP5 is controlled by the control signal CNT in antiphase with the opening/closing of the NMOS transistor MN6 and the PMOS transistor MP6. The reliable on/off control for a broad input range may be achieved by the transfer gate constitution of the switch unit.

Second Embodiment

Figure 10:
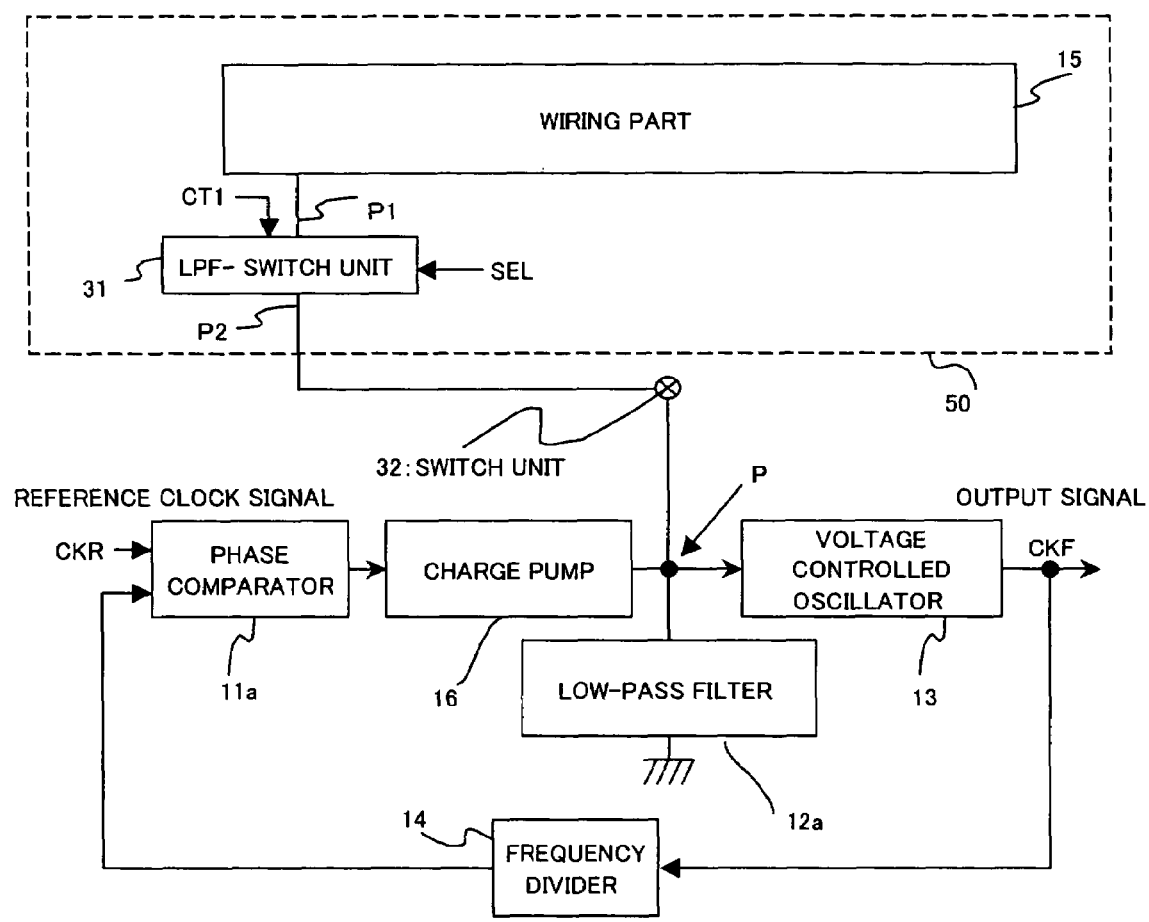
FIG. 10 is a block diagram showing a configuration of a PLL circuit according to a second embodiment of the present invention.

FIG. 10 depicts a block diagram showing the constitution of a PLL circuit according to a second embodiment of the present invention. In FIG. 10, the same symbols as those of FIG. 2 denote the same parts or components and hence the detailed description of these parts or components is dispensed with. In the PLL circuit of FIG. 10, there are additionally provided an LPF (low-pass filter)-switch unit 31, connected to one end of the wiring part 15, and a switch unit 32. The switch unit 32 is arranged between the LPF-switch unit 31 and one end (node) P of the low-pass filter 12a. There is also provided a noise generating circuit 50 which is made up by the wiring part 15 and the LPF-switch unit 31. The basic operation of the second embodiment is such that, as in FIG. 2, the charge pump outputs positive or negative current pulses, in keeping with an up-signal or a down-signal, received from the phase comparator 11a, and such that these current pulses are integrated by the low-pass filter 12a and output to the voltage controlled oscillator 13 as a control signal freed of the high frequency components. In this control signal are contained variations ascribable to a noise signal induced by the noise generating circuit 50. The LPF-switch unit 31 extracts only desired frequency components from the noise output to a node P1 from the wiring part 15 to output the so extracted components via switch unit 32 to a node P which is an output end of the low-pass filter 12a. The switch unit 32 is provided for isolating the LPF-switch unit 31 for completely shutting off the noise intrusion at the time of the phase-lock operation of the PLL circuit. Hence, the switch unit 32 may be replaced by only the switch of the LPF-switch unit 31. Preferably, the wiring part 15 is provided in the vicinity of the power supply or the ground, or in the vicinity of the noise-generating circuitry such as CPU and RAM, liable to generate the noise, in order to pick up the noise.

Figure 11:
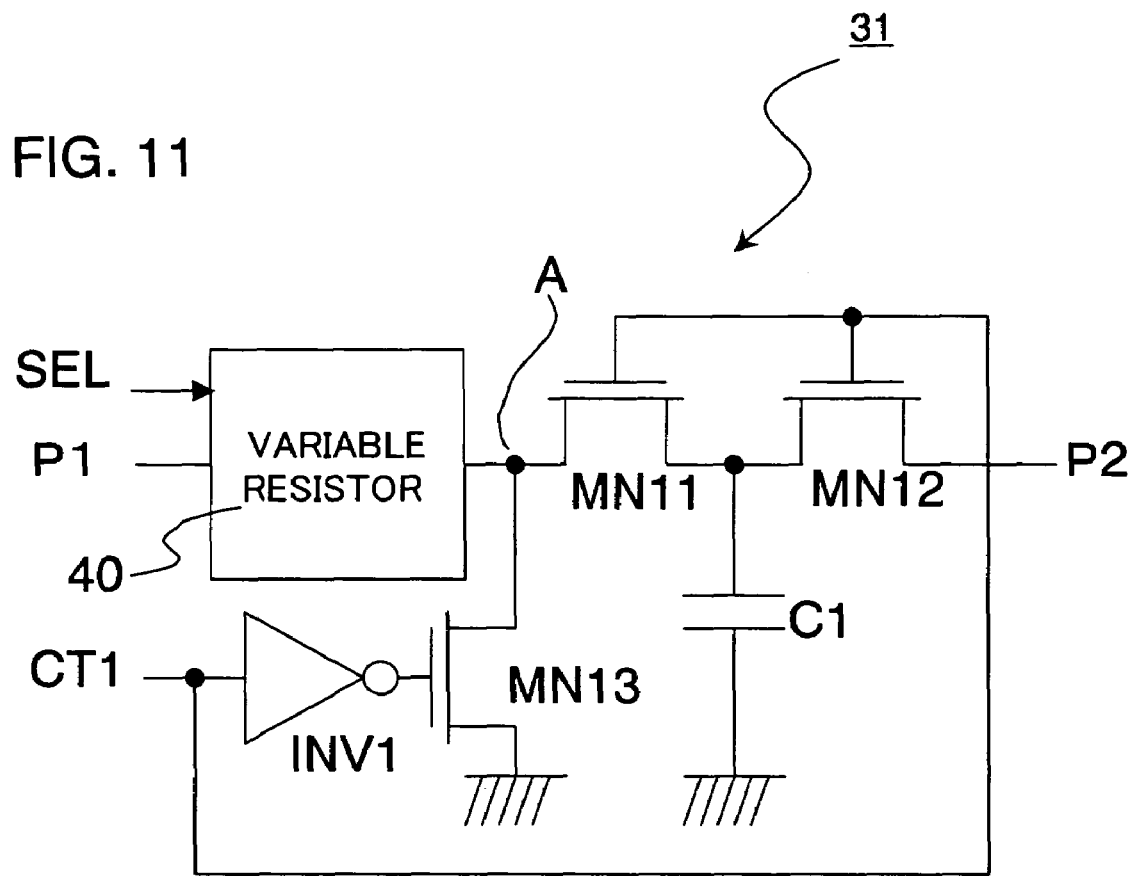
FIG. 11 is a circuit diagram of an LPF-switch unit formed by NMOS circuits.

The operation of the LPF-switch unit 31 will be described in detail. FIG. 11 depicts a circuit diagram showing an illustrative configuration of an LPF-switch unit. Referring to FIG. 11, the LPF-switch unit 31 receives the noise, output from the wiring part 15, at the node P1, to output the so received noise at a node P2, under control by a control signal CT1. The LPF-switch unit 31 is made up by a variable resistor 40, a capacitor C1, an inverter INV1, and NMOS transistors MN11, MN12 and MN13, making up a switch of the LPF-switch unit. A resistor of the variable resistor 40 and the capacitor C1 make up an LPF (low-pass filter). The cut-off frequency of the LPF may be changed by changing the resistance value of the variable resistor 40, as will be explained subsequently. The noise having the desired frequency component may be injected into the node P by changing the cut-off frequency. If, when the noise is output to the node P2, "1" (HIGH level) is given to the control signal CT1, the NMOS transistors MN11 and MN12 are turned on, while the NMOS transistor MN13, the gate of which is supplied with a signal corresponding to the control signal CT1, inverted by the inverter INV1, is turned off. Hence, the noise received by the node P1 of the LPF-switch unit 31 is output to the node P2. If noise injection is unneeded, the control signal CT1 is set to "0" (LOW level), whereby the NMOS transistors MN11 and MN12 are turned off, while the NMOS transistor MN13 is turned on to release the noise to ground.

Figure 12:
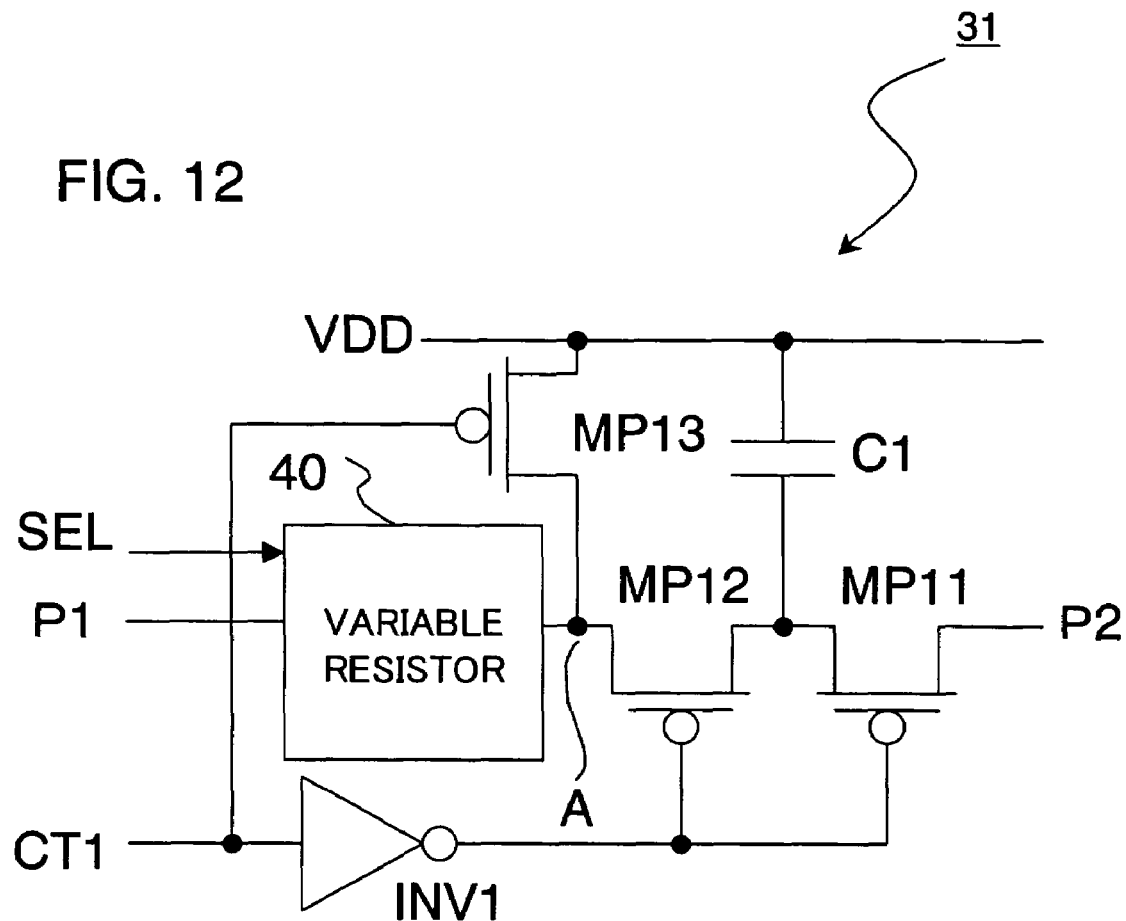
FIG. 12 is a circuit diagram of an LPF-switch unit formed by PMOS circuits.

FIG. 12 depicts a circuit diagram showing another illustrative configuration of the LPF-switch unit 31. In FIG. 12, the LPF-switch unit 3 1 is made up by a variable resistor 40, a capacitor C1, an inverter INV1, and PMOS transistors MP11, MP12 and MP13, making up a switch of the LPF-switch unit. The LPF-switch unit 31 of FIG. 12 differs from the LPF-switch unit 31 of FIG. 11 as to the fact that the NMOS transistors, in the LPF-switch unit of FIG. 11, are replaced by PMOS transistors, and that the noise is released to the power supply VDD. The operation of the present embodiment is similar to that of the LPF-switch unit of FIG. 11. It is also possible to use a transfer gate in which the MOS transistors of the LPF-switch unit are replaced by a CMOS circuit, in a manner not shown, in order to inject the noise at a middle potential different than the power supply VDD and the ground.

Figure 13:
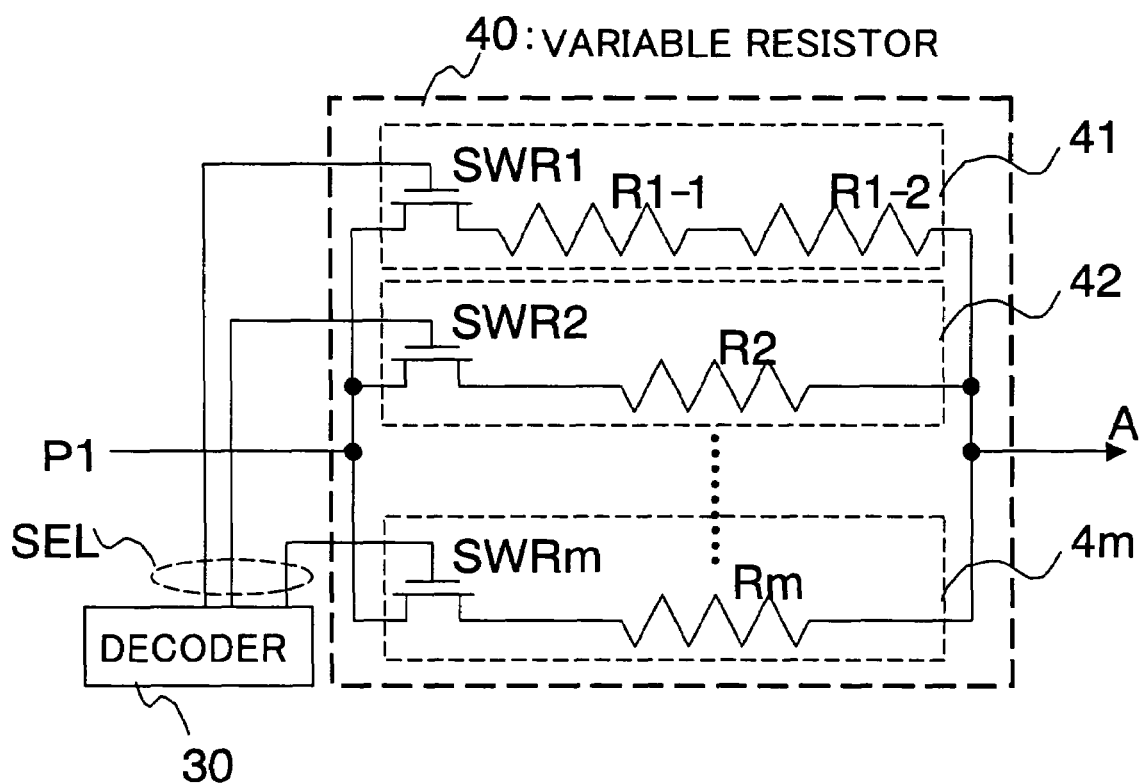
FIG. 13 is a circuit diagram of a variable resistor.

The variable resistor 40 will now be described. Referring to FIG. 13, the variable resistor 40 is made up by plural MOS switches SWR1, SWR2, ..., SWRm and plural resistor devices R1-1, R1-2, R2, ..., Rm. A plural number of resistor-switch units 41, 42, ..., 4m, each made up by a series connection of a MOS switch and a resistor device or resistor devices, are connected parallel to one another. It is noted that, in FIG. 13, the resistor devices R1-1 and R1-2 are connected in series with each other and make up the resistor-switch unit 41 along with the MOS switch SWR1. The resistor device Ri, and the MOS switch SWRi, make up the resistor-switch unit 4i, where i=2 to m. One or more of the MOS switches may be turned on or off by a selection signal SEL. Thus, the noise, supplied from the node P1, is output to a node A through one or more of the resistor-switch units, as selected by the selection signal SEL. That is, the cut-off frequency of the LPF may be changed by changing the combined resistance from the node P1 to the node A by the selection signal SEL.

With the above-described noise generating circuit 50, only desired frequency components may be taken out from the noise induced in the wiring part 15, arranged in the vicinity of the noise source, to inject the frequency components so taken out to the node P. The desired frequency components may be selected by setting the selection signal SEL in a desired manner. Moreover, the noise injection may be controlled by the control signal CTI. Meanwhile, if it is desired to inject the noise at all times, the LPF-switch unit 31 may be replaced by a simple LPF having no switching function. On the other hand, if the cut-off frequency for obtaining the desired frequency components has been determined from the outset, the variable resistor 40 may be constituted by a fixed resistor, in which case the configuration for varying the resistance value by the selection signal SEL may be omitted.

Third Embodiment

Figure 14:
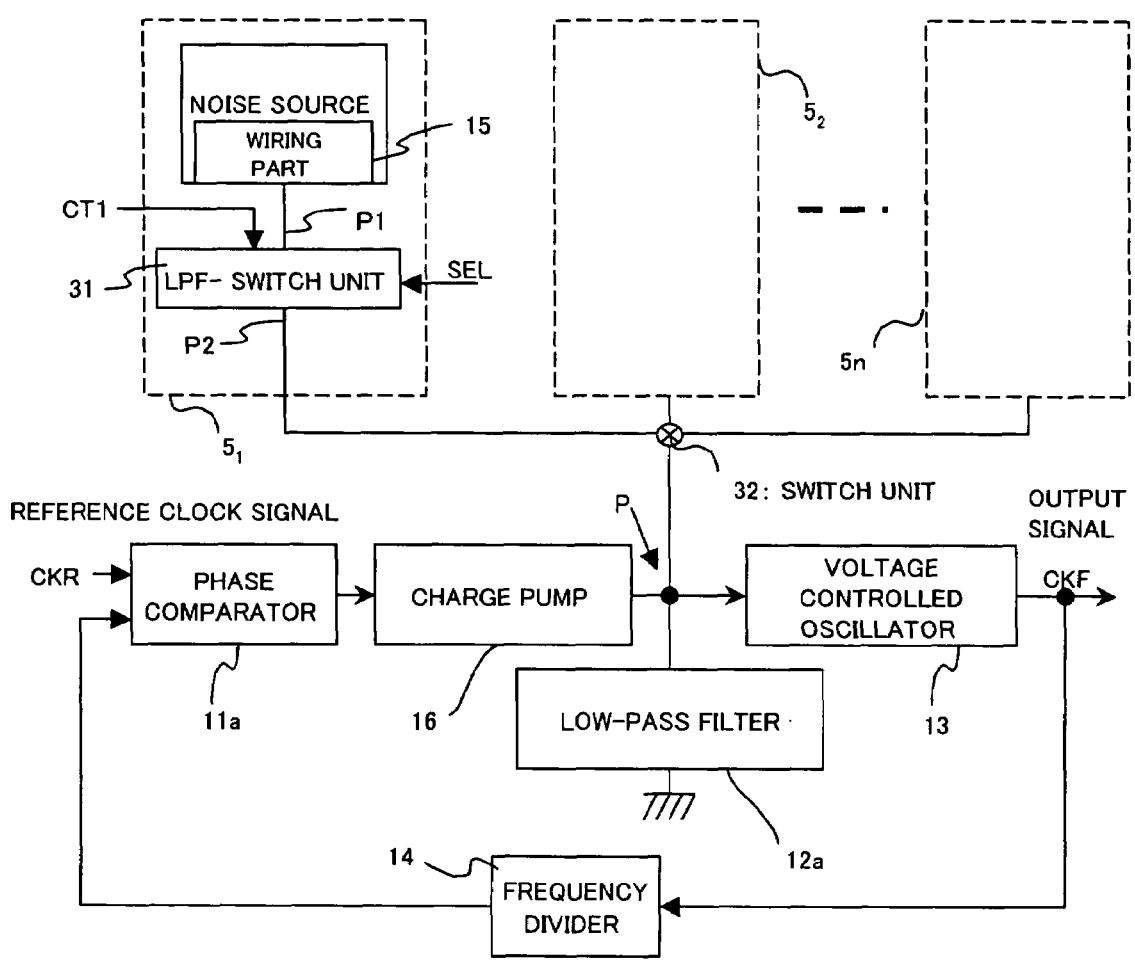
FIG. 14 is a block diagram showing the configuration of a PLL circuit according to a third embodiment of the present invention.

FIG. 14 is a block diagram showing the configuration of a PLL circuit according to a third embodiment of the present invention. The PLL circuit of FIG. 14 is made up by a plural number of the noise generating circuits of the PLL circuit configuration of the second embodiment. These noise generating circuits are shown as $5_1, 5_2, \ldots, 5n$. In FIG. 14, the same symbols as those of FIG. 10 depict the same parts or components, and the corresponding description is dispensed with. The basic operation of the present embodiment is similar to that of the PLL circuit shown in FIG. 10. Since there are provided a plural number of the noise generating circuits $5_1, 5_2, \ldots, 5n$, these circuits may be arranged in variable locations, for example, in the vicinity of the power supply unit, ground or the circuitry susceptible to noise, such as CPU or RAM. The outputs of the noise generating circuits $5_1, 5_2, \ldots, 5n$ are collected at a switch unit 32. This switch unit turns the connection between the outputs of the plural noise generating circuits $5_1, 5_2, \ldots, 5n$ and the node P on or off in a controlled manner. That is, the function of the switch unit 32 is to carry out on/off control of the connection between the outputs of the noise generating circuits $5_1, 5_2, \ldots, 5n$ and the node P. More specifically, the switch unit 32 is provided for isolating the LPF-switch units 31 in the noise generating circuits $5_1, 5_2, \ldots, 5n$, and for completely shutting off the noise injection at the time of the phase-lock operation of the PLL circuit, as in the second embodiment.

With the use of the plural noise generating circuits, as in FIG. 14, the noise of variable sorts or the noise with desired frequency components may readily be injected in the node P. Moreover, with the use of plural noise generating circuits, having the same noise source, it becomes possible to control the magnitude of the noise.

Figure 15:
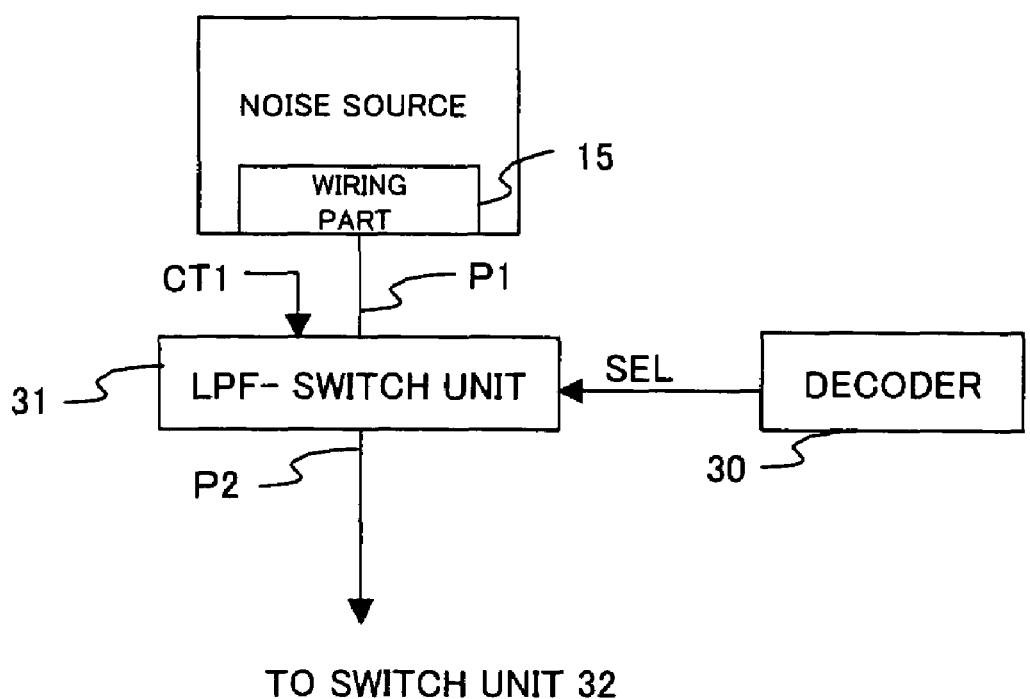
FIG. 15 is a circuit diagram showing a typical structure of a noise generating circuit.

It is noted that the noise generating circuits 5j, where j=1 to n, may be provided with a decoder 30 for decoding data, not shown, supplied from outside, to generate the selection signal SEL, as shown in FIG. 15.

With the second and third embodiments, described above, the noise having desired frequency components may be injected into the voltage controlled oscillator 13, as necessary, in order to variably control the amount of the jitter of an output signal from the voltage controlled oscillator 13.

Although the present invention has so far been explained with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A phase locked loop (PLL) circuit, comprising:
   a phase comparator that compares a phase of a reference input signal to that of a feedback output signal of a frequency divider to output a signal corresponding to a phase difference therebetween;
   a filter unit that passes a low frequency component of an output signal of said phase comparator;
   a voltage controlled oscillator that generates an oscillation signal of an oscillation frequency controlled based on an output voltage from said filter unit; and
   a wiring part that induces noise from at least one of a power supply line and a grounding line,
   wherein the noise signal, induced in said wiring part, is added to an output signal from said filter unit to provide a further component to said output signal, and
   wherein said frequency divider frequency-divides said oscillation signal to output a resulting signal to said phase comparator.

2. The PLL circuit according to claim 1, wherein an end of a wiring, included in said wiring part, is connected to an input end of said voltage controlled oscillator.

3. The PLL circuit according to claim 1, wherein said wiring part includes a wiring associated with at least one of a power supply line and a grounding line.

4. The PLL circuit according to claim 3, wherein said wiring part includes one or more switch units for making adjustable an effective length of said wiring.

5. The PLL circuit according to claim 4, wherein said switch unit includes first and second switch devices, connected in cascade with each other at a connection point of wiring segments of said wiring, and a third switch device, connected across a junction of said first and second switch devices and a ground or a power supply, said third switch device performing an opening/closing operation in reverse to said first and second switch devices.

6. The PLL circuit according to claim 5, wherein said first to third switch devices comprise MOS transistors controlled in opening closing by control signals applied to gates thereof.

7. A semiconductor device provided with the PLL circuit according to claim 1.

8. A phase locked loop (PLL) circuit, comprising:
   a phase comparator that compares a phase of a reference input signal to that of a feedback output signal of a frequency divider to output a signal corresponding to a phase difference therebetween;
   a filter unit that passes a low frequency component of an output signal of said phase comparator;
   a voltage controlled oscillator that generates an oscillation signal of an oscillation frequency controlled on a basis of an output voltage of said filter unit,
   a wiring part that induces noise from at least one of a power supply line and a grounding line; and
   a low-pass filter (LPF) connected to said wiring part,
   wherein said frequency divider frequency-divides said oscillation signal to output a resulting signal to said phase comparator, and
   wherein the noise signal, induced in said wiring part, is added via said LPF to an output signal from said filter unit.

9. The PLL circuit according to claim 8, wherein a cut-off frequency of said LPF is made controllable.

10. The PLL circuit according to claim 9, wherein said LPF includes a switch that intermits an output signal of said LPF.

11. The PLL circuit according to claim 10, wherein there is provided a plurality of sets each being composed of said wiring part and said LPF.

12. The PLL circuit according to claim 10, wherein said wiring part is associated with at least one of a power supply line and a grounding line.

13. The PLL circuit according to claim 12, wherein said wiring part includes one or more switch units that make adjustable an effective length of said wiring.

14. The PLL circuit according to claim 13, wherein said switch unit includes first and second switch devices, connected in cascade with each other at a connection point of wiring segments of said wiring, and a third switch device, connected across a junction of said first and second switch devices and a ground or a power supply, said third switch device performing an opening/closing operation in reverse to said first and second switch devices.

15. The PLL circuit according to claim 14, wherein said first to third switch devices comprise MOS transistors controlled in opening/closing by control signals applied to gates thereof.

16. A semiconductor device including the PLL circuit as defined in claim 8.

17. The PLL circuit according to claim 1, wherein variations in the output signal from the induced noise comprise a control signal output from the filter unit, and
   wherein the control signal contain the variations therein.

18. The PLL circuit according to claim 1, wherein the induced noise is induced from one of capacitive coupling or electromagnetic induction.

19. The PLL circuit according to claim 1, further comprising a noise generating circuit, the noise generating circuit comprising a low-pass filter switch-unit, the low-pass filter switch-unit configured to extract predetermined frequency components from the induced noise.

20. The PLL circuit according to claim 19, wherein the low-pass filter switch-unit shuts off the induced noise at a time of a phase-lock operation of the PLL circuit.

* * * * *